(12) United States Patent
Ryu et al.

(10) Patent No.: US 8,026,167 B2
(45) Date of Patent: Sep. 27, 2011

(54) SEMICONDUCTOR DEVICE AND METHOD OF MANUFACTURING THE SAME

(75) Inventors: Sang Wook Ryu, Cheongju-si (KR); Jin Ho Park, Yeongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 414 days.

(21) Appl. No.: 12/122,460

(22) Filed: May 16, 2008

(65) Prior Publication Data

US 2008/0284024 A1 Nov. 20, 2008

(30) Foreign Application Priority Data

May 17, 2007 (KR) ........................ 10-2007-0047889

(51) Int. Cl.
*H01L 21/4763* (2006.01)
(52) U.S. Cl. .......................... 438/627; 438/622; 438/629
(58) Field of Classification Search .................. 438/622, 438/627, 629
See application file for complete search history.

(56) References Cited

U.S. PATENT DOCUMENTS

| | | | | |
|---|---|---|---|---|
| 5,695,810 A * | 12/1997 | Dubin et al. | ................... | 438/643 |
| 6,124,203 A * | 9/2000 | Joo et al. | ........................ | 438/653 |
| 6,144,099 A * | 11/2000 | Lopatin et al. | ................ | 257/758 |
| 6,372,649 B1 | 4/2002 | Han et al. | | |
| 6,391,771 B1 | 5/2002 | Naik et al. | | |
| 6,602,773 B2 * | 8/2003 | Lee et al. | ....................... | 438/586 |
| 6,815,339 B2 * | 11/2004 | Choi | ............................. | 438/634 |
| 2004/0137373 A1 * | 7/2004 | Lei et al. | ........................ | 430/313 |
| 2005/0266605 A1 * | 12/2005 | Kawakami | ...................... | 438/99 |

FOREIGN PATENT DOCUMENTS

| KR | 10-1999-0024046 | 1/2001 |
|---|---|---|
| KR | 10-2002-0067710 | 5/2004 |

* cited by examiner

*Primary Examiner* — Thien F Tran
(74) *Attorney, Agent, or Firm* — Saliwanchik, Lloyd & Eisenschenk

(57) ABSTRACT

A metal interconnection of semiconductor device and method for fabricating the same is provided. The semiconductor device can include a semiconductor substrate formed with device structures such as transistors. An interlayer dielectric layer can be formed on the semiconductor substrate with a metal interconnection formed therethrough. A spacer can be formed on at least a portion of a sidewall of the metal interconnection. A diffusion barrier can be formed on an upper surface of the metal interconnection.

10 Claims, 4 Drawing Sheets

SEMICONDUCTOR DEVICE AND METHOD OF MANUFACTURING THE SAME

CROSS-REFERENCE TO RELATED APPLICATION

The present application claims the benefit under 35 U.S.C. §119 of Korean Patent Application No. 10-2007-0047889, filed May 17, 2007, which is hereby incorporated by reference in its entirety.

BACKGROUND

Image sensors are semiconductor devices for converting optical images into electric signals.

Among the types of image sensors, a charge coupled device (CCD) includes MOS (metal oxide silicon) capacitors, which are aligned closely to each other to store or transfer charge carriers.

In contrast, a CMOS (complementary MOS) image sensor employs a switching mode to sequentially detect outputs of pixels by using MOS transistors prepared corresponding to the number of pixels through a CMOS technology that uses peripheral devices, such as a control circuit and a signal processing circuit.

Recently, the number of pixels of the CMOS image sensor has increased to a Mega level, so the size of the pixels has become reduced. Such a reduction in the size of the pixel causes restriction to the size of a micro-lens formed on the pixel, so that the focus length of the micro-lens has become shortened. For this reason, a metal interconnection layer constituting a logic circuit around the pixel is also limited.

As the number of pixels of the CMOS image sensor increases, improved interconnection processes are important in order to enlarge a pixel area.

BRIEF SUMMARY

Embodiments of the present invention provide a semiconductor device capable of ensuring reliability of a metal interconnection by inhibiting a copper interconnection from being oxidized when the metal interconnection is formed, and a method of manufacturing the same.

A semiconductor device according to an embodiment includes a semiconductor substrate formed with various devices, an interlayer dielectric layer on the semiconductor substrate, a metal interconnection formed through the interlayer dielectric layer, a spacer formed at a sidewall of the metal interconnection, and a diffusion barrier formed on an upper surface of the metal interconnection.

A method of manufacturing the semiconductor device according to an embodiment includes forming a lower interconnection on a semiconductor substrate, forming an interlayer dielectric layer on the semiconductor substrate, forming a metal interconnection through the interlayer dielectric layer and connected to the lower interconnection, forming a spacer at a sidewall of the metal interconnection, and forming a diffusion barrier on an upper surface of the metal interconnection.

DETAILED DESCRIPTION

Hereinafter, a semiconductor device and a method of manufacturing the same according to an embodiment will be described with reference to accompanying drawings.

Figure 7:
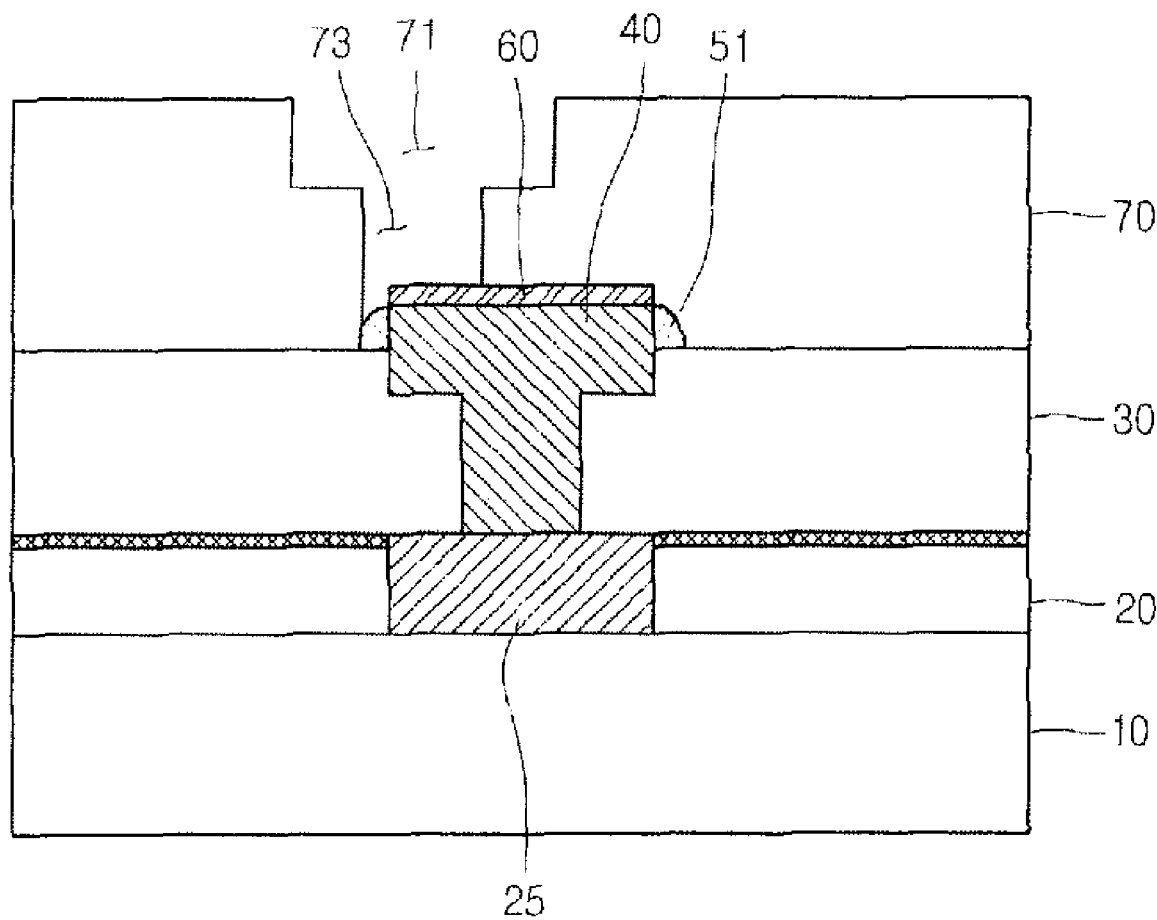

FIG. 7 is a cross-sectional view of the semiconductor device according to the embodiment.

Referring to FIG. 7, a semiconductor device can include a semiconductor substrate 10 formed with various devices (not shown). A lower interconnection 25 can be provided on the substrate connected to a device structure on the semiconductor substrate 10. An interlayer dielectric layer 30 can formed on the semiconductor substrate 10. A metal interconnection 40 can be provided through the interlayer dielectric layer 30 to connect to the lower interconnection 25. The metal interconnection 40 can have spacers formed on at least a portion of the metal interconnection's sidewalls. A diffusion barrier 60 can be formed on an upper surface of the metal interconnection 40.

In an embodiment, the metal interconnection 40 can include a barrier metal layer, a copper seed layer and a copper layer.

When the metal interconnection 40 according to embodiments of the present invention is employed in an image sensor, a focal length between the metal interconnection 40 and a photodiode can be reduced, so that sensitivity of the image sensor may be improved.

The spacers 51 at the sidewalls of the metal interconnection 40 can be formed with metal. The metal can include, for example, Ta or TaN. The spacers 51 can be used to inhibit lateral sides of the metal interconnection 40 from being exposed in a subsequent process in case of misalignment. The spacers 51 inhibit the metal interconnection 40 including copper from being etched.

The diffusion barrier 60 can include, for example, cobalt and tungsten (CoW). The diffusion barrier 60 can be used to inhibit diffusion of copper.

When the metal interconnection 40 and the diffusion barrier 60 according to embodiments of the present invention are employed in an image sensor, the refractive index of light can be improved, so that quality of the image sensor can be improved.

Hereinafter, a manufacturing process for a semiconductor device according to an embodiment will be described with reference to FIGS. 1 to 7.

Figure 1:
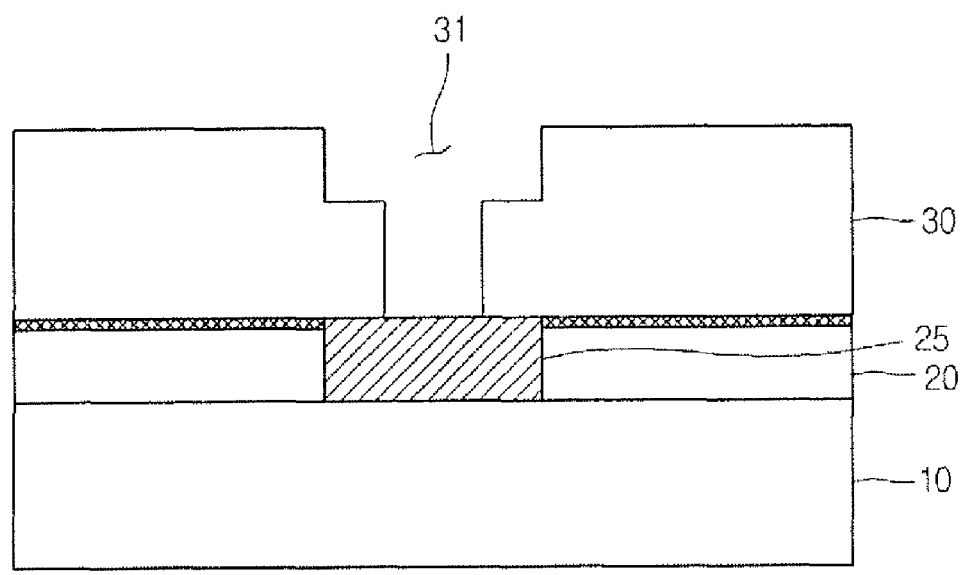
FIGS. 1 to 7 are cross-sectional views showing a method of manufacturing a semiconductor device according to an embodiment of the present invention.

Referring to FIG. 1, a first interlayer dielectric layer 20 including a lower interconnection 25 can be formed on a semiconductor substrate 10.

Although not shown in the drawings, an isolation layer can be formed on the semiconductor substrate 10 to define an active area and a field area on the semiconductor substrate 10. Various device structures, such as a source/drain and a gate electrode of a transistor, may be formed on the active area.

If the semiconductor device is an image sensor, a photodiode for a unit pixel and a CMOS circuit can be formed on the active area of the substrate 10.

After the devices have been formed on the semiconductor substrate 10, the lower interconnection 25 can be formed connected to a structure or device on the semiconductor substrate 10.

According to certain embodiments, the lower interconnection 25 can include copper or aluminum. The first interlayer dielectric layer 20 can include, for example, an oxide layer or a nitride layer.

Although not shown in the drawings, if the lower interconnection 25 includes copper, a diffusion barrier can be formed on the first interlayer dielectric layer 20 where the lower interconnection 25 is formed. A diffusion barrier can also be formed on the lower interconnection 25.

Then, a second interlayer dielectric layer 30 can be formed on the semiconductor substrate 10 including the first interlayer dielectric layer 20. The second interlayer dielectric layer 30 can include, for example, an oxide layer and/or a nitride layer. In one embodiment, the second interlayer dielectric layer 30 has a thickness of about 6000~18000 Å.

Then, the second interlayer dielectric layer 30 can be etched through a dual damascene process to form a trench 31 (and/or via) for exposing an upper surface of the lower interconnection 25.

The trench 31 can be formed by performing photolithography processes using a mask that defines the trench or a via area after coating a photoresist film (not shown) on the second interlayer dielectric layer 30. Thus, the lower interconnection 25 can be exposed through the trench 31.

Although not shown in the drawings, the first and second interlayer dielectric layers 20 and 30 can have multi-layer structures. In addition, a nitride-based etch stop layer can be provided between layers of the multi-layer structure in order to inhibit the lower interconnection and the insulating layer from being damaged.

Figure 2:
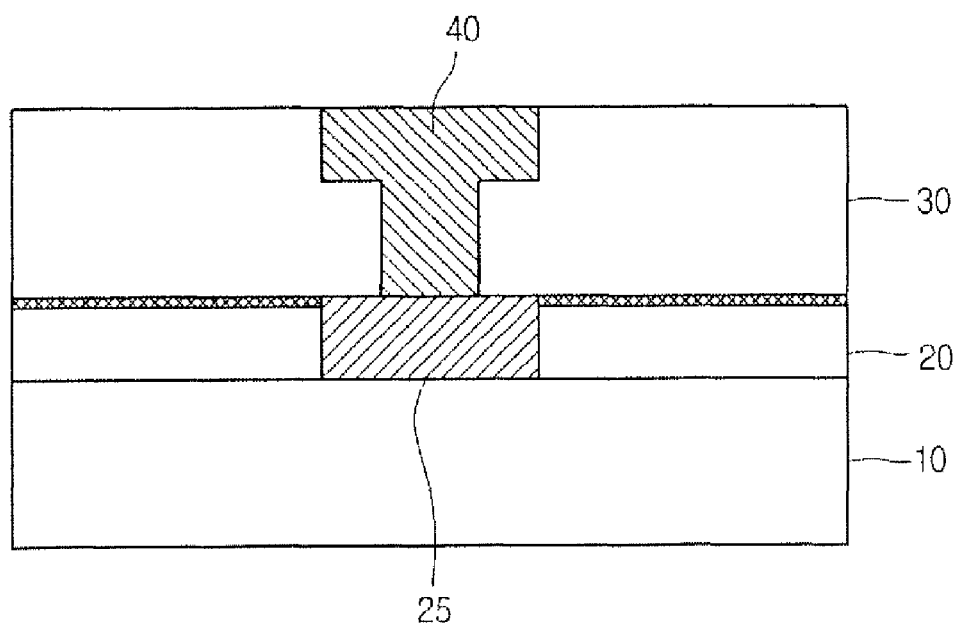

Referring to FIG. 2, a metal interconnection can be formed in the trench 31 on the second interlayer dielectric layer 30.

In order to form the metal interconnection 40, in one embodiment, copper is filled in the trench 31 through an electric plating process, and then the copper is polished through a chemical mechanical polishing (CMP) process until a surface of the second interlayer dielectric layer 30 is exposed. Accordingly, a copper metal interconnection 40 connected to the lower interconnection 25 can be obtained.

Although not shown in the drawings, a barrier metal layer and a copper seed layer can be sequentially formed before the copper is filled in the trench 31 to inhibit the copper from diffusing and to facilitate the gap fill process, respectively.

Figure 3:
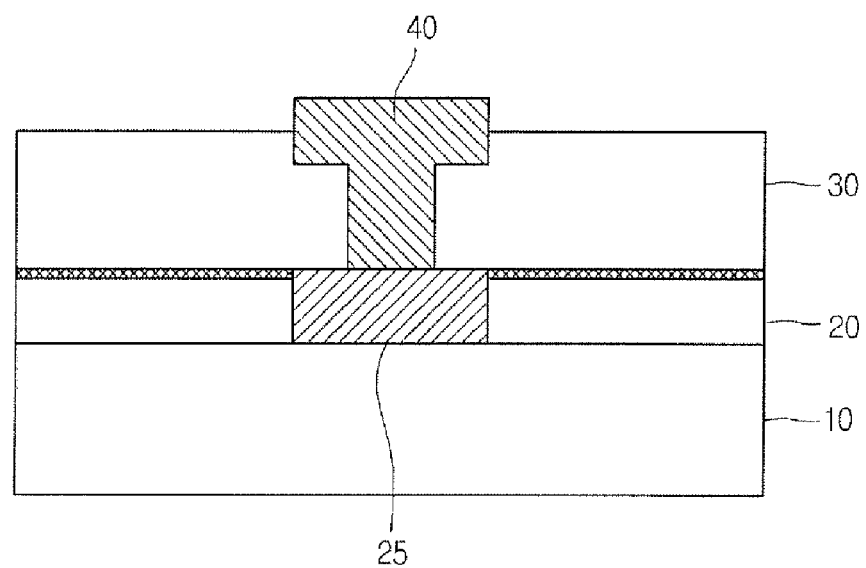

Referring to FIG. 3, a recess process can be performed relative to the second interlayer dielectric layer 30, to partially expose the sidewalls of the metal interconnection 40.

That is, according to an embodiment, the second interlayer insulating layer 30 can be wet-etched by using a BOE (buffered oxide etchant) solution. In one embodiment, the second interlayer dielectric layer 30 is removed by a thickness of about 50 to 2000 Å so that edges and the sidewall of the metal interconnection 40 are exposed.

The BOE solution can be used in certain embodiments because the copper used for the metal interconnection 40 has strong etch-resistant characteristic against the BOE solution.

Therefore, if the etching process is performed by using the BOE solution, the metal interconnection 40 is not etched when the second interlayer dielectric layer 30 is etched, so that the sidewall of the metal interconnection 40 can be exposed. In one embodiment, the BOE solution is an etching solution including fluorine.

Figure 4:
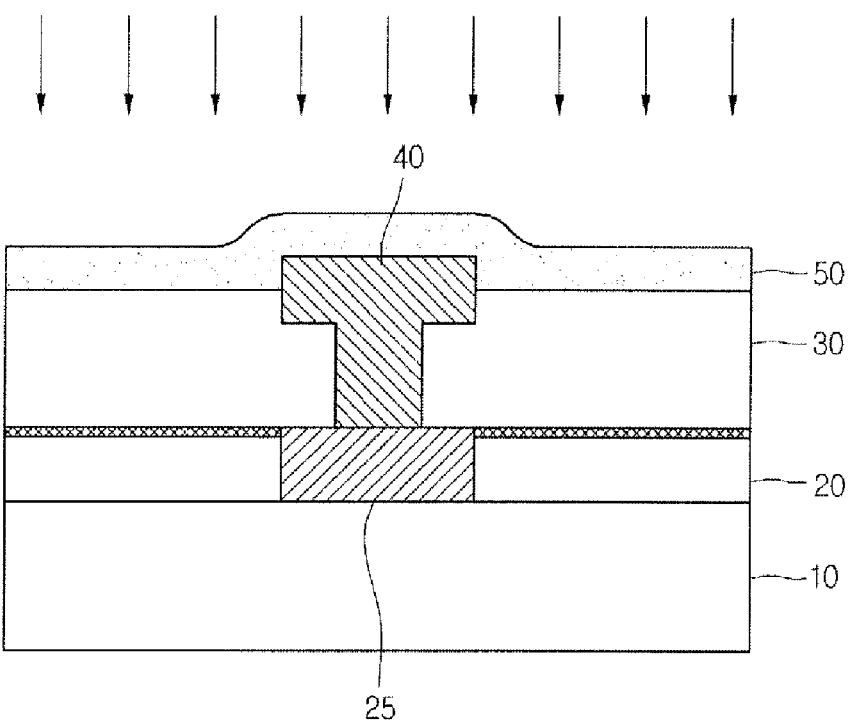

Referring to FIG. 4, a metal layer 50 can be deposited on the metal interconnection 40 and the second interlayer dielectric layer 30.

The metal layer 50 can include Ta or TaN. In an embodiment, the metal layer 50 can be deposited at a thickness of about 50 to 2000 Å. The exposed sidewalls and the upper surface of the metal interconnection 40 can covered with the metal layer 50.

Figure 5:
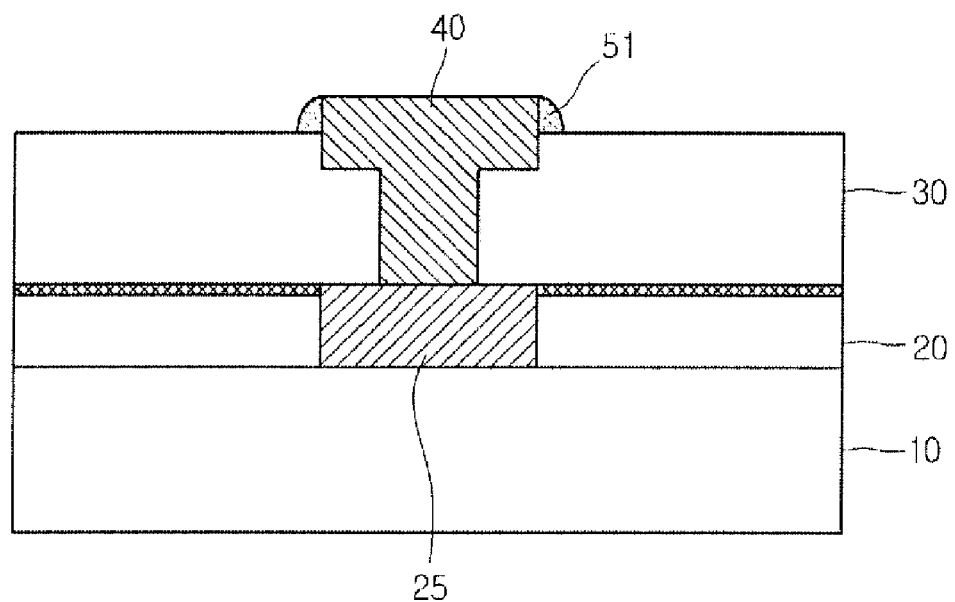

Referring to FIG. 5, the spacers 51 can be formed at sidewalls of the metal interconnection 40.

The spacers 51 can be obtained by etching the metal layer 50. In an embodiment, the spacers 51 can be formed by fully etching the metal layer 50. The spacers 51 can form where the metal layer re-deposits or is not removed during the etching process. Etching gas including a halogen element, such as Cl, Br, of F, can be provided while the metal layer 50 is being etched to form the spacers 51 at the sidewalls of the metal interconnection 40.

Due to the spacers 51, the sidewalls of the metal interconnection 40 are not exposed. In addition, the spacers 51 can inhibit the copper of the metal interconnection 40 from diffusing.

Figure 6:
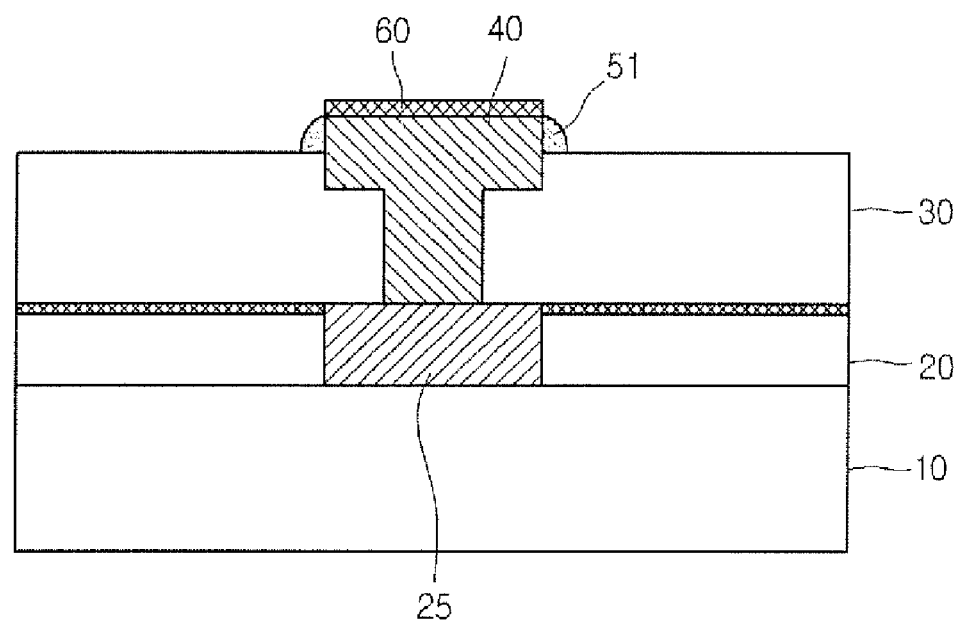

Referring to FIG. 6, a diffusion barrier 60 can be formed on the metal interconnection 40.

The diffusion barrier 60 inhibits the copper of the metal interconnection 40 from diffusing into the second interlayer dielectric layer 30 or a subsequent dielectric layer formed on the metal interconnection 40. To this end, the diffusion barrier 60 includes a metallic material. In one embodiment, the diffusion barrier 60 can be obtained by depositing a metallic material. The material for the diffusion barrier 60 can be $CoW_x$ (where x is an integer) having electric conductivity of about $10^{-3}$/Ohm·m. In an embodiment, the diffusion barrier 60 can be deposited through an electroless plating process.

If the diffusion barrier 60 is formed through the electroless plating process, a plating layer having a high-dense structure with a uniform thickness can be obtained.

By forming the diffusion barrier 60 using $CoW_x$, the dielectric constant of the diffusion barrier 60 can be significantly lowered as compared with that of the insulating layer. In addition, mobility of copper can be lowered and resistance of the metal interconnection can be reduced, so that quality of the semiconductor device can be improved.

In particular, if the diffusion barrier 60 including $CoW_x$ is employed for an image sensor, the refractive index and transmittance of light can be improved so that the quality of the image sensor can be improved.

Referring to FIG. 7, a third interlayer dielectric layer 70 can be formed on the substrate 10 having the diffusion barrier 60. In one embodiment, the third insulating layer 70 has a thickness of about 6000~18000 Å.

Then, the third interlayer dielectric layer 70 can be etched through a dual damascene process to form a trench 71 (and/or via) for exposing the metal interconnection 40.

If a via hole is initially formed through a via-first dual damascene process, a borderless via hole 73, which exposes the sidewall of the metal interconnection 40, may be formed during the dual damascene process due to a misalignment of the mask.

In addition, if the borderless via hole 73 is over-etched, the barrier metal layer of the metal interconnection 40 provided below the borderless via hole 73 can also be etched. In this case, the copper layer is exposed so that the copper layer may be oxidized. The spacers 51 formed at the sidewalls of the metal interconnection 40 can be used to address this problem. In particular, the spacers 51 inhibit the metal interconnection 40 from being exposed through the borderless via hole 73, thereby improving reliability of the semiconductor device.

According to an embodiment, the spacers are formed at the sidewalls of the metal interconnection, so that a defect of the metal interconnection caused by misalignment of the mask can be reduced or inhibited, improving reliability of the semiconductor device.

In addition, if the metal interconnection according to certain embodiments is employed in an image sensor, the focal length of incident light can be reduced, so that sensitivity of the image sensor can be improved.

Further, since a diffusion barrier including stable metallic material can be formed on the metal interconnection according to an embodiment, diffusion of copper can be inhibited.

According to embodiments, the refractive index of an image sensor can be reduced due to the diffusion barrier, so that quality of the image sensor can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor device, comprising:
    forming an interlayer dielectric layer on a semiconductor substrate;
    forming a metal interconnection through the interlayer dielectric layer;
    forming a spacer comprising Ta or TaN at a portion of a sidewall of the metal interconnection; and
    forming a diffusion barrier on an upper surface of the metal interconnection by depositing a diffusion barrier material on the metal interconnection having the spacer after forming the spacer at the portion of the sidewall of the metal interconnection.

2. The method according to claim 1, wherein forming the metal interconnection comprises:
    forming a via trench hole in the interlayer dielectric layer by performing a damascene process;
    forming a barrier metal layer and a seed layer in the via trench hole; and
    forming a copper layer on the seed layer.

3. The method according to claim 1, wherein forming the diffusion barrier comprises performing an electroless plating process.

4. The method according to claim 3, wherein the diffusion barrier comprises cobalt and tungsten.

5. The method according to claim 1, wherein forming the spacer comprises:
    recessing the interlayer dielectric layer such that at least the portion of the sidewall of the metal interconnection is exposed;
    depositing a metal layer comprising the Ta or TaN on the interlayer dielectric layer including the metal interconnection; and
    etching the metal layer such that the spacer is formed at the sidewall of the metal interconnection.

6. The method according to claim 5, wherein recessing the interlayer dielectric layer comprises performing a wet-etch.

7. The method according to claim 6, wherein performing the wet-etch comprises using a BOE (buffered oxide etchant) solution.

8. The method according to claim 7, wherein the BOE solution comprises fluorine.

9. The method according to claim 5, wherein etching the metal layer comprises using etching gas including a halogen element.

10. The method according to claim 9, wherein the halogen element is Cl, Br or F.

* * * * *